United States Patent [19]

van de Plassche et al.

[11] 4,179,687

[45] Dec. 18, 1979

[54] ANALOG-TO-DIGITAL CONVERTER CIRCUIT EMPLOYING ITERATIVE SUBTRACTION

[75] Inventors: Rudy J. van de Plassche; Eise C. Dijkmans, both of Eindhoven, Netherlands

[73] Assignee: U.S. Philips Corporation, New York, N.Y.

[21] Appl. No.: 818,105

[22] Filed: Jul. 22, 1977

[30] Foreign Application Priority Data

Aug. 30, 1976 [NL] Netherlands .......................... 7609608

[51] Int. Cl.$^2$ ............................................ H03K 13/02
[52] U.S. Cl. ........................ 340/347 AD; 340/347 M; 179/15 AV
[58] Field of Search ................... 340/347 M, 347 AD; 179/15 AV; 307/237

[56] References Cited

U.S. PATENT DOCUMENTS

| | | | |
|---|---|---|---|
| 3,340,526 | 9/1967 | Sugarman | 340/347 M |
| 3,537,101 | 10/1970 | Campanella et al. | 340/347 AD |
| 3,599,204 | 8/1971 | Severin | 340/347 AD |
| 3,735,390 | 5/1973 | Drangeid et al. | 340/347 AD |

OTHER PUBLICATIONS

Schmid, Electronic Analog/Digital Conversions, Van Nostrand Reinhold Company, 1970, pp. 318 & 319.

Primary Examiner—Thomas J. Sloyan
Attorney, Agent, or Firm—Thomas A. Briody; Edward J. Connors, Jr.; James J. Cannon, Jr.

[57] ABSTRACT

An analog-to-digital conversion circuit having a number of series-connected stages, each stage determining the difference between a signal current input and a reference current input, and at positive values of said difference transferring a current proportional to said difference to the succeeding stage. In each successive stage, the reference current is subtracted from the signal current until the residual current is smaller than the reference current. The number of successive stages in which this subtraction takes place can be detected to indicate the level of the input current. Each stage includes a common point for receiving the difference between the signal current and the reference current, a current path from said common point to its output for transferring a current proportional to the difference if positive, a current path from said common point to a current sink if said difference is negative; said current paths being unidirectional and biased such that only one is forward biased at one point in time. Each stage also detects the polarity of said difference to obtain a digital measure of the value of the signal current.

31 Claims, 7 Drawing Figures

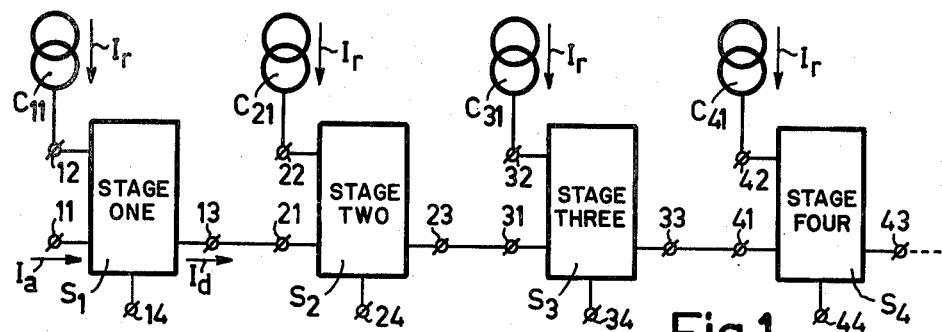
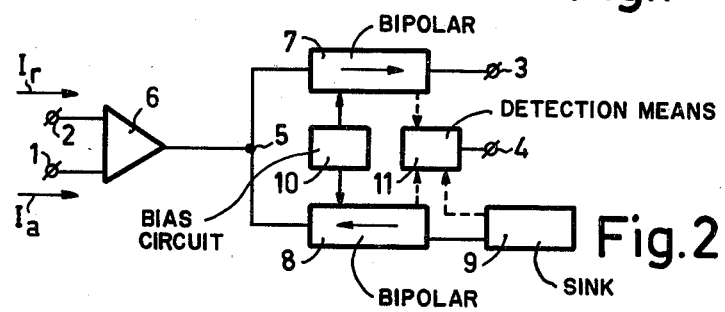
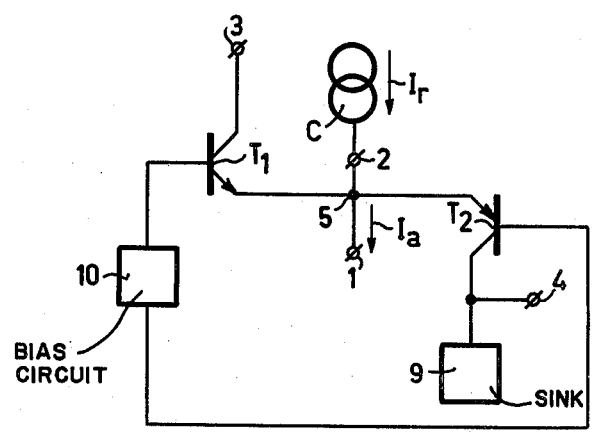
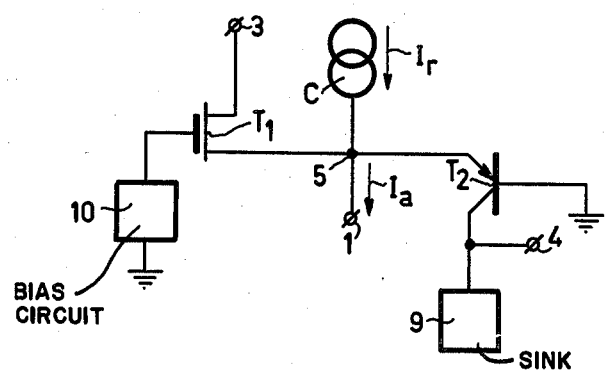

ANALOG-TO-DIGITAL CONVERTER CIRCUIT EMPLOYING ITERATIVE SUBTRACTION

BACKGROUND OF THE INVENTION

1. Field of the Invention

The invention relates to an analog-to-digital converter. Such converters are known and serve to convert the value of an analogue signal into a digital code.

2. Description of the Prior Art

An analog-to-digital converter is described by C. E. Woodward, K. H. Konkle and M. L. Naiman in an article entitled "A monolithic Voltage-Comparator Array for A/D Convertors" in "IEEE Journal of Solid-State Circuits", Vol. SC-10, No. 6, Dec. 1975, pages 392–396. This converter comprises a multitude of comparators whose noninverting inputs all receive a signal voltage and whose inverting inputs each time receive a different reference voltage, which reference voltages correspond to the input signal levels to be distinguished.

As generally only a very small voltage range is available and many different levels are to be distinguished, the comparators should have a fairly high voltage gain and a small offset. As appears from FIG. 3 of said article, this leads to fairly complex comparators, which have a comparatively high dissipation and which occupy much space in an integrated circuit.

It is an object of the invention to provide an analog-to-digital converter which can be realized very simply and which is suitable for processing signal currents.

SUMMARY OF THE INVENTION

This invention pertains to an improved analog-to-digital converter having a plurality of series-connected stages, each stage comprising a means for determining the difference between the values of first and second input currents applied to said means and, at positive values of said difference, transferring a current which is proportional to said difference to an output, the first input current of a following stage being constituted by the current at the output of a stage which precedes said subsequent stage and means for detecting the polarity of said difference.

A preferred embodiment of the analog-to-digital converter in accordance with the invention is characterized in that the stages comprise a common point for receiving said difference; a first current path between said point and the output for transferring a current which is proportional to said difference if said difference is positive; a second current path between said point and a current sink for draining said difference if it is negative; which two current paths each have a forward and a reverse direction, the forward directions in the two current paths, viewed from said common point, being oppositely directed, and the impedance in the forward direction of the one current path being low relative to the impedance in the reverse direction of the other current path viewed from the common point; and means for biasing the two current paths in such a way that only one of the two current paths is forward-biased.

BRIEF DESCRIPTION OF THE DRAWINGS

The invention will now be described in more detail with reference to the drawings, in which:

FIG. 1 shows a block diagram of an analog-to-digital converter in accordance with the invention, FIG. 2 schematically represents the circuit arrangement of a stage of the analog-to-digital converter of FIG. 1, FIG. 3 shows a first embodiment of such a stage of FIG. 2, FIG. 4 shows a second embodiment of such a stage of FIG. 2.

DESCRIPTION OF THE PREFERRED EMBODIMENTS

Figure 5:
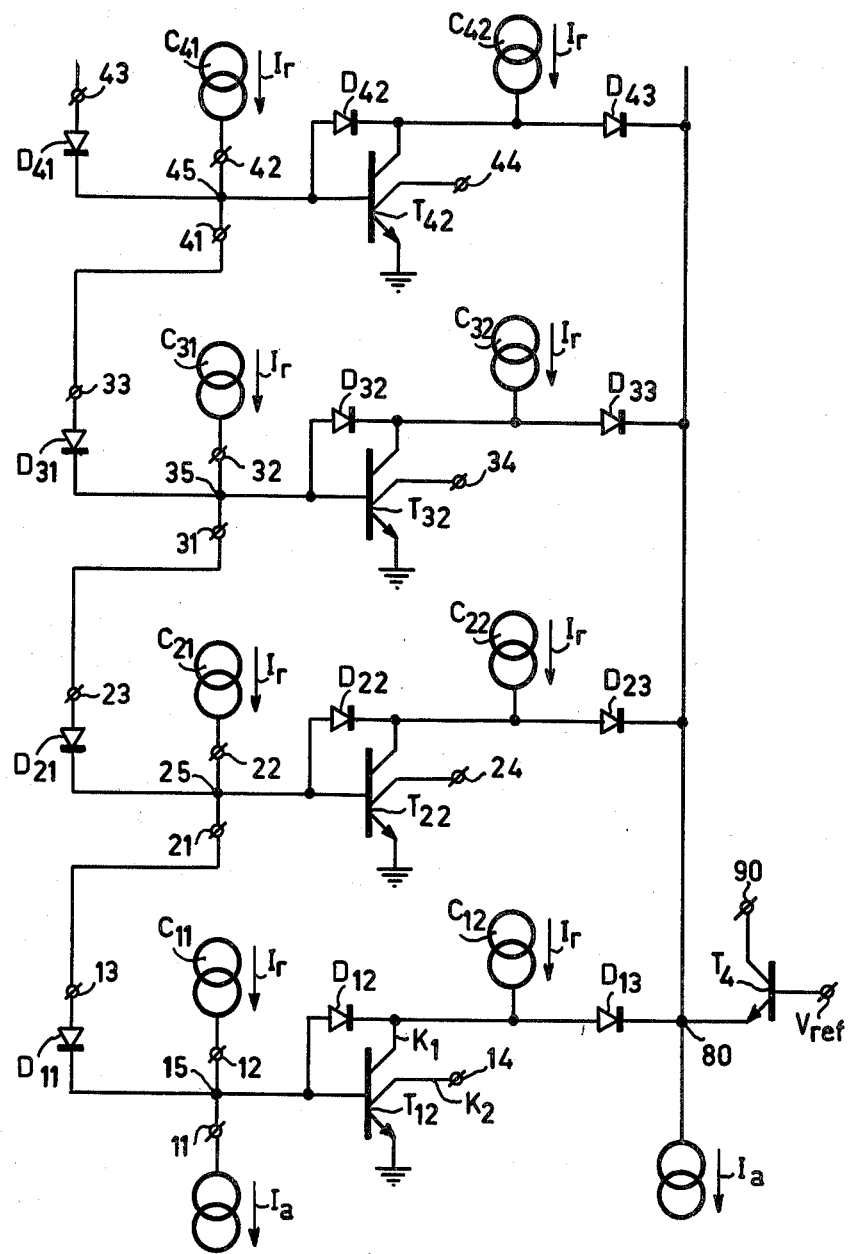
FIG. 5 shows an embodiment of an analog-to-digital converter of FIGS. 1 and 2.

FIG. 1 shows a block diagram of an analog-to-digital converter in accordance with the invention. Four stages $S_1$, $S_2$, $S_3$ and $S_4$ are shown, but the number of stages may be substantially higher. Each stage has a first input 11, 21, 31 and 41 respectively; a second input 12, 22, 32 and 42 respectively; an output 13, 23, 33 and 43 respectively; and a detection output 14, 24, 34 and 44 respectively. The first inputs 21, 31 and 41 of the stages $S_2$, $S_3$ and $S_4$ are connected to the inputs 13, 23 and 33 of the preceding stages $S_1$, $S_2$ and $S_3$. By means of current sources $C_{11}$, $C_{21}$, $C_{31}$ and $C_{41}$ reference currents are applied to the second inputs 12, 22, 32 and 42 of the stages $S_1$, $S_2$, $S_3$ and $S_4$. These current sources supply currents $I_r$, as shown in the Figure. However, it is alternatively possible to apply mutually different currents to the second inputs 12, 22, 32 and 42, in order to obtain a specific sensitivity curve for the analog-to-digital converter. The analog input signal is applied to the first input 11 of the first stage $S_1$ as a current $I_a$.

If for each stage the output current $I_d$ equals $I_a - I_r$ when $I_a$ is greater than $I_r$, an analog-to-digital conversion is obtained. A current $I_r$ is then subtracted from the signal $I_a$ until the remainder is smaller than $I_r$. The number of times that a current $I_r$ can be subtracted from the input current $I_a$ is then a measure of the magnitude of said input current. This measure must be available for further processing, for example as a binary code. For this purpose each stage comprises a detection output 14, 24, 34 and 44 respectively. The signal at this output is an indication of whether the output 13, 23, 33 and 43 respectively carries or does not carry a current, or an indication of the polarity of the difference between the currents at the first and second inputs.

It is not necessary that the difference of the input currents is always transferred from one stage to the next stage. It is possible to transfer for example a multiple or a fraction so as to influence the sensitivity curve.

FIG. 2 schematically shows the circuit arrangement of a stage of the analog-to-digital converter in accordance with the invention. The stage comprises a means 6 for determining the difference $(I_a - I_r)$ between the currents at the inputs 1 and 2 and for applying this difference current to a junction 5. From this junction 5 a first current path leads to the output 3 via an element 7 with a forward direction and a reverse direction. In the Figure, the forward direction is symbolically represented by an arrow. It may also be directed the other way round, but it must always be directed so that when the current $I_a$ is greater than the current $I_r$ the positive difference can flow via said first current path. From the junction 5 a second current path leads to a current sink 9 via an element 8 with a forward direction and a reverse direction which, viewed from junction 5, are opposed to the forward and the reverse directions of the element 7, which current sink is an element which takes up the negative difference current $I_a - I_r$. In order to ensure that the difference current $I_a - I_r$ takes the correct current path, it is necessary that viewed from the junction 5 the impedance in the forward direction of the one current path is always comparatively low relative to the impedance in the reverse direction of the other current path.

The stage of FIG. 2 furthermore comprises a biasing circuit 10 which biases the elements 7 and 8 in such a way that the two elements 7 and 8 can never be forward biased at the same time. This is necessary in order to prevent a current from flowing between the output 3 and the current sink 9 via the elements 7 and 8. In addition, the stage comprises a detection means 11 for determining the polarity of the difference $I_a - I_r$ in order to obtain a logic signal. As is symbolically indicated by the dashed arrows this may be effected by detecting current passage in the elements 7, 8 or 9.

FIG. 3 shows a first example of a stage in accordance with FIG. 2. In order to obtain said difference between the currents $I_r$ and $I_a$ and to apply it to junction 5, the simplest possibility has been chosen for this stage, namely applying the currents $I_r$ and $I_a$ to junction 5 with opposite polarity. Junction 5 is connected to output 3 via the emitter-collector path of an npn-transistor $T_1$. This transistor thus constitutes the element 7 of FIG. 2. In addition, junction 5 is connected to the current sink 9 via the emitter-collector path of a pnp transistor $T_2$. This transistor $T_2$ constitutes the element 8 of FIG. 2. In order to obtain an indication of the polarity of the difference $I_a - I_r$, the collector of transistor $T_2$ is connected to the output 4. If the current sink 9 is for example a diode whose cathode is connected to a point of reference potential, current passage through transistor $T_2$ can be detected by shunting said diode with a base-emitter junction of a further transistor.

In order to prevent the two transistors $T_1$ and $T_2$ from conducting simultaneously, a bias source 10 is included between the bases of the transistors $T_1$ and $T_2$. If these bias voltages are such that the voltage on the base of transistor $T_2$ is, for example, 0.3 V higher than the voltage on the base of transistor $T_1$, the two transistors can never conduct simultaneously. A direct interconnection of the bases of the transistors $T_1$ and $T_2$ has the same effect. As junction 5 is connected to the output 3 of a preceding stage, the base bias voltages of the consecutive stages should each time be 1 V higher, so that the transistors $T_1$ have a sufficiently high-collector emitter voltage. As a result these transistors are not bottomed and the collector current is always substantially equal to the emitter current.

If the current $I_a$ is greater than the current $I_r$, the difference flows to the output 3 via the emitter-collector path of transistor $T_1$ and hence to a subsequent stage. Transistor $T_2$ is then reverse-biassed, which can be detected at the collector of transistor $T_2$. If the current $I_a$ is smaller than the current $I_r$, the difference flows to the current sink 9 via the collector-emitter path of transistor $T_2$. This can also be detected at the collector of transistor $T_2$. Other detection possibilities are, for example, the measurement of the base-emitter voltage of transistor $T_1$ or $T_2$.

In order to obtain optimum equality of the collector and the emitter current of the transistor $T_1$, the current gain factor of transistor $T_1$ must be sufficiently high. It is also possible to replace transistor $T_1$ by two transistors connected in Darlington arrangement. Another possibility to achieve this, is to replace transistor $T_1$ by an insulated-gate field-effect transistor. This possibility is illustrated in FIG. 4, in which $T_1$ is the field effect transistor whose main current path is included between output 3 and junction 5. Except for the bias of the transistors $T_2$ and $T_1$, this circuit is identical to the circuit in accordance with FIG. 3.

The forward direction of transistor $T_1$ depends on the gate bias. This bias which is obtained from source 10 should be such that the main electrode of transistor $T_1$ which is connected to junction 5 functions as source electrode when transistor $T_2$ is cut off. Furthermore, this bias voltage should be such that the transistors $T_2$ and $T_1$ cannot conduct simultaneously. If, as is shown in FIG. 4, the base of transistor $T_2$ is connected to ground, these requirements are met when the voltage of source 10 relative to ground equals the threshold voltage of transistor $T_1$.

Since, when an insulated-gate field-effect transistor is used, the equality of the currents at the drain and source electrodes is not influenced by the voltage on the drain electrode (the electrode which is connected to the output 3), the requirement imposed on the circuit arrangement in accordance with FIG. 3 does not apply. The gate electrodes of the transistors $T_1$ of all stages may therefore be connected to the same source 10 and the base electrodes of all transistors $T_2$ may be connected to ground.

It is to be noted that the element 8, as well as the element 7, need not necessarily be a transistor. For example transistor $T_2$ and current sink 9 may be replaced by a single diode whose cathode (or the anode if all components are of the other conductivity type and if the direction of the input currents $I_a$ and $I_r$ is reversed) is connected to a point of reference potential, for example ground. Detection can then by effected by shunting this diode by the base-emitter junction of a further transistor.

FIG. 5 shows an example in which the element 7 (FIG. 2) is a diode $D_{11}$, $D_{21}$, $D_{31}$ and $D_{41}$ respectively. The Figure shows the first four stages $S_1$, $S_2$, $S_3$ and $S_4$ of an analog-to-digital converter in accordance with the invention. The inputs 21, 31 and 41 of the stages $S_2$, $S_3$ and $S_4$ are respectively connected to the outputs 13, 23 and 33 of the stages $S_1$, $S_2$ and $S_3$ respectively. The analog signal $I_a$ is applied to the input 11 of stage $S_1$ and currents $I_r$ are applied to all inputs 12, 22, 32 and 42.

The junction 15, 25, 35 and 45 of each stage is connected to output 13, 23, 33 and 43 respectively via a diode $D_{11}$, $D_{21}$, $D_{31}$ and $D_{41}$ respectively. Junction 15, 25, 35 and 45 respectively is connected to the base of an npn transistor $T_{12}$, $T_{22}$, $T_{32}$ and $T_{42}$ respectively so as to form the second current path. Said transistor is equipped with two collectors $K_1$ and $K_2$. The collectors $K_1$ are connected to the bases of the transistors $T_{12}$, $T_{22}$, $T_{32}$ and $T_{42}$ respectively via a diode $D_{12}$, $D_{22}$, $D_{32}$ and $D_{42}$. As a result, the last-mentioned transistors will be turned on in the case of a current drive on the base electrode and act as a short circuit. Preferably the diodes are of the Schottky type, so that the transistors $T_{12}$, $T_{22}$, $T_{32}$ and $T_{42}$ cannot become bottomed. The difference current is then drained to ground. This conductive state of these transistors may be detected on the second collectors $K_2$. These collectors may be connected directly to gates of a logic circuit.

If the input current $I_a$ is smaller than the reference current $I_r$, the current $I_r-I_a$ will flow to the base of transistor $T_{12}$ and turn on this transistor. Then no current will flow to the output 13 of stage $S_1$. As a result of this the transistors $T_{22}$, $T_{32}$ and $T_{42}$ in all further stages will be turned on. As the emitters of all transistors $T_{12}$, $T_{22}$, $T_{32}$ and $T_{42}$ are connected to points at the same potential, (this is ground in the drawing,) the potentials on all junctions 15, 25, 35 and 45 will be equal, so that none of the diodes $D_{11}$, $D_{21}$, $D_{31}$ and $D_{41}$ can conduct. Thus a correct bias is obtained automatically.

If the current $I_a$ is greater than the current $I_r$ but smaller than twice said current, the difference $I_a-I_r$ is drained through diode $D_{11}$ of stage $S_1$. As junction 25 of the stage $S_2$ has a potential equal to the base potential of transistor $T_{22}$ of said stage, the potential on the base of transistor $T_{12}$ of stage $S_1$ is one diode voltage smaller, so that transistor $T_{12}$ of stage $S_1$ cannot conduct. Thus again a correct bias is obtained automatically. If the current $I_a$ exceeds the value $2 I_r$, transistor $T_{22}$ of the stage $S_2$ is also cut off. The number of transistors $T_{12}$, $T_{22}$, $T_{32}$ and $T_{42}$ which are turned off is consequently a measure of the value of the signal current $I_a$. If for example nine stages are connected in series, and the current $I_r$ equals $0.1\ I_{a\ max}$, where $I_{a\ max}$ is the range of the converter, the current $I_a$ is converted into a digital signal, which digital signal represents the first decimal of the analog value of the current $I_a$. In practice this is generally not accurate enough. In order to enable more decimals to be reproduced, several converters in series are necessary. For an input signal current, these converters should always receive the input signal current of the preceding convertor minus n times the reference current $I_r$ of the preceding converter, n being the number of cut-off transistors $T_{12}$, $T_{22}$, $T_{32}$ and $T_{42}$ in said preceding converter. One tenth of the reference current $I_r$ of the preceding converter should then always be applied to the second inputs of a following converter as reference current.

In order to enable more decimals of the current $I_a$ to be decoded, the residual current should be taken from an output. In the converter in accordance with FIG. 5 this is achieved in that the collectors $K_1$ of the transistors $T_{12}$, $T_{22}$, $T_{32}$, $T_{42}$ of the stages $S_1$, $S_2$, $S_3$, $S_4$ are connected to a current source $C_{12}$, $C_{22}$, $C_{32}$, $C_{42}$, which carry a current equal to the reference current $I_r$, and via diodes $D_{12}$, $D_{22}$, $D_{32}$ and $D_{42}$ to a junction 80. The forward direction of these diodes, viewed from the current sources $C_{12}$, $C_{22}$, $C_{32}$, $C_{42}$, is always opposite to the forward direction of the transistors $T_{12}$, $T_{22}$, $T_{32}$ and $T_{42}$. The input current $I_a$ is also applied to junction 80, which can for example be effected with a current dividing circuit. Junction 80 is furthermore connected to the emitter of an npn transistor $T_4$ whose collector is connected to a connection point 90 and whose base is connected to a reference potential $V_{ref}$.

If a certain transistor $T_{12}$, $T_{22}$, $T_{32}$ or $T_{42}$ is conductive, the current $I_r$ from the corresponding current source $C_{12}$, $C_{22}$, $C_{32}$ or $C_{42}$ is drained via said transistor and the voltage on the anode of the corresponding diode $D_{13}$, $D_{23}$, $D_{33}$, $D_{43}$ is approximately equal to zero volts. If the reference voltage $V_{ref}$ is sufficiently high, for example 1 V, the corresponding diode $D_{13}$, $D_{23}$, $D_{33}$, $D_{43}$ is reverse-biased. However, if a certain transistor $T_{12}$, $T_{22}$, $T_{32}$, $T_{42}$ is non-conductive, the current $I_r$ flows from the corresponding current source $C_{12}$, $C_{22}$, $C_{32}$, $C_{42}$ to the junction 80 via the corresponding diode $D_{13}$, $D_{23}$, $D_{33}$, $D_{43}$. As a result of this the emitter current of transistor $T_4$ always equals $I_a-nI_r$, n being the number of cut-off transistors $T_{12}$, $T_{22}$, $T_{32}$ and $T_{42}$, and the desired residual current can consequently be taken from the connection point 80.

Figure 6:
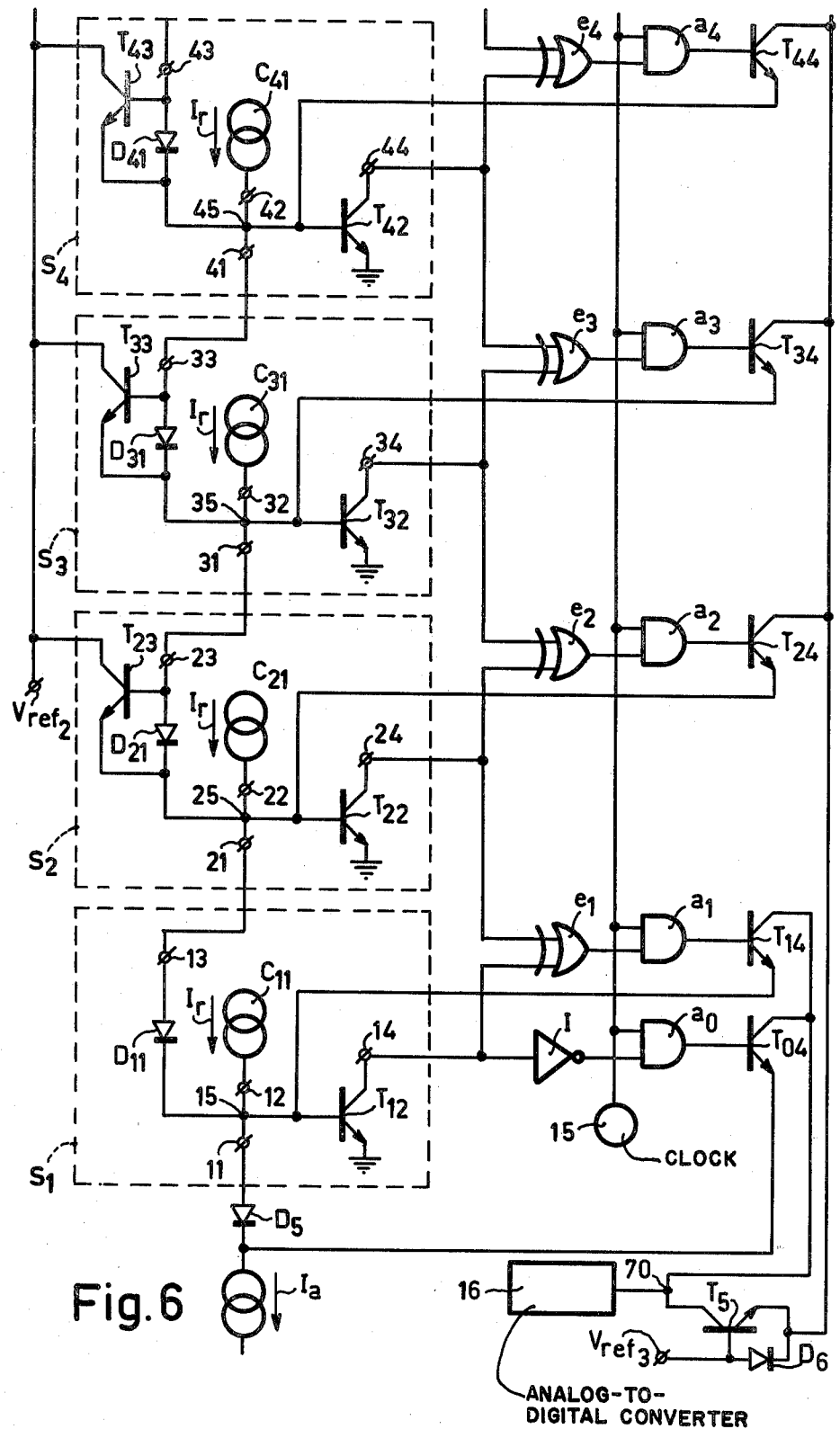
FIG. 6 shows an embodiment of an analog-to-digital converter with a modified sensitivity curve.

FIG. 6 shows an analog-to-digital converter in accordance with the invention, destined for pulse code modulation (PCM). The Figure shows four stages $S_1$, $S_2$, $S_3$ and $S_4$ of the eight stages which are needed. The stages which are not shown are identical to the stages $S_2$, $S_3$ and $S_4$.

Of the stage $S_1$ the junction 15 is connected to the output 13 via the cathode-anode path of diode $D_{11}$, which output 13 is connected to the input 21 of stage $S_2$, and connected to the base of transistor $T_{12}$ whose emitter is connected to a point of fixed voltage, ground in the drawing, and the collector to a detection output point 14. The junction 15 is furthermore connected to an input 12, to which a reference current $I_r$ is applied with the aid of a current source $C_{11}$, and to an input 11 for receiving an input current $I_a$.

The other stages $S_2$, $S_3$, $S_4$ and the four subsequent stages which are not shown are of an identical circuit design. These further stages are provided with a current dividing circuit for halving the output current. As an example, the diode $D_{21}$ in the stage $S_2$, which diode is included between the common point 25 and the output 23, is shunted by the base-emitter junction of a transistor $T_{23}$, whose base is connected to the anode and whose emitter is connected to the cathode of this diode, and whose collector leads to a current sink, for example a point of reference potential $V_{ref2}$, as shown. To obtain a division by a factor two, the effective emitter area of transistor $T_{23}$ in an integrated circuit should be equal to the effective diode area of diode $D_{21}$.

Owing to the described step only half the positive difference between a current at the input 21 and the reference current at input 22 is transferred to output 23 and thus to the input 31 of the next stage $S_3$.

The input 11 of the stage $S_1$ is connected to an input current source via the anode-cathode path of a diode $D_5$, which source carries the input current $I_a$.

The analog-to-digital converter of FIG. 6 operates in a similar manner to that of FIG. 5. If the current $I_a$ is smaller than the reference current $I_r$, the negative difference flows to the base of transistor $T_{12}$ and this transistor is turned on. All further transistors $T_{22}$, $T_{32}$, $T_{42}$, ... will also be saturated and across all the diodes $D_{11}$, $D_{21}$, $D_{31}$, $D_{41}$, ... a voltage will exist which is equal to zero volts. If the value of the current $I_a$ exceeds the value of the current $I_r$, transistor $T_{12}$ cuts off and the positive difference flows via diode $D_{11}$ to the input 21 of the following stage $S_2$.

Conduction or non-conduction of the transistors $T_{11}$, $T_{21}$, $T_{31}$, $T_{41}$, ... can be detected at their collectors, detection outputs 14, 24, 34, 44, .... For this purpose, a collector impedance may be included, but if for example transistor-transistor logic (TTL) is connected to these detection outputs, the gate impedances may function as collector impedance. A conducting transistor $T_{11}$, $T_{21}$, $T_{31}$, $T_{41}$, ... then provides a "low" level on the relevant detection output and a non-conducting transistor a "high" level.

In order to enable the residual current, $I_a$ minus a number of times the reference current $I_r$, to be fed to a following analog-to-digital converter 16, the circuit arrangement furthermore includes a number of logic gates. Detection output 14 is connected to an input of an AND gate $a_0$ via an inverter I. The detection outputs of two consecutive stages are each connected to the inputs of an EXCLUSIVE-OR gate. As an example, the detection outputs 14 and 24 are connected to the inputs of the EXCLUSIVE-OR gate $e_1$, the detection outputs 24 and 34 to the inputs of the EXCLUSIVE-OR gate $e_2$, and so forth. The outputs of the eight (four shown and four not shown) EXCLUSIVE-OR gates $e_1$, $e_2$, $e_3$, $e_4$, ... are connected to the inputs of the AND gates $a_1$, $a_2$, $a_3$, $a_4$, ... respectively. Of all AND gates $a_0$, $a_1$, $a_2$, $a_3$, $a_4$, ... the second inputs are connected to a source 15 for supplying a clock signal. The outputs of these AND-gates are connected to the base electrodes of switching transistors $T_{04}$, $T_{14}$, $T_{24}$, $T_{34}$, $T_{44}$, .... The emitter of the switching transistor $T_{04}$ is connected to the cathode of diode $D_5$ and the emitters of the switching transistors $T_{14}$, $T_{24}$, $T_{34}$, $T_{44}$, ... are connected to the common points 15, 25, 35, 45, ... respectively. The collectors of the switching transistors $T_{04}$ and $T_{14}$ lead directly to a connection point 70 and the collectors of the other switching transistors $T_{24}$, $T_{34}$, $T_{44}$, ... via a current dividing circuit. This current dividing circuit may be of a circuit design as shown. The base emitter junction of a transistor $T_5$ is shunted by a diode $D_6$ whose effective diode area equals the effective emitter area of transistor $T_5$. If the diode $D_6$ and the transistor $T_5$ are integrated on one substrate, the current which flows through the diode $D_6$ is always substantially equal to the emitter current of transistor $T_5$. The emitter of transistor $T_5$ is connected to the collectors of the transistor $T_{24}$, $T_{34}$, $T_{44}$, ... and the collector to the connection point 70. The anode of diode $D_6$ is connected to a current sink, for example a point of reference potential $V_{ref3}$, as shown. In this way the collector current of transistor $T_5$ equals half the current which is applied to the connection of the emitter of transistor $T_5$ and the cathode of diode $D_6$.

Connection point 70 is connected to the input of analog-to-digital converter 16. This converter is not shown in detail and may for example be as shown in one of the Figures. This analog-to-digital converter 16 comprises 16 stages, each with reference currents equal to $I_r/16$. As a result, the current applied to connection point 70 can always be digitized in 16 steps. As the current applied to the converter 16 is maximum $I_r$, 15 stages will suffice.

If the current $I_a$ is smaller than the current $I_r$, all transistors $T_{12}$, $T_{22}$, $T_{32}$, $T_{42}$, ... are conductive and all detection outputs 14, 24, 34, 44, ... are consequently "low". The outputs of the EXCLUSIVE-OR gates $e_1$, $e_2$, $e_3$, $e_4$, ... are then "low" and the output of the inverter I "high". If the source 15 supplies a clock pulse, only switching transistor $T_{04}$ is turned on and the current $I_a$ flows to the connection point 70 via the emitter-collector path of said transistor $T_{04}$.

If the current $I_a$ is greater than $I_r$ but smaller than $2I_r$, only detection output 14 is "high" and only the output of the EXCLUSIVE-OR gate $e_1$ is "high", so that at the instant that the source 15 supplies a clock pulse only the output of the AND-gate $a_1$ becomes "high" and transistor $T_{14}$ is turned on. The positive residual current $I_a - I_r$ then flows to connection point 70.

If the current $I_a$ is greater than $2I_r$ but smaller than $4I_r$, the transistors $T_{12}$ and $T_{22}$ are cut off and the detection outputs 14 and 24 are "high", so that only the output of the EXCLUSIVE-OR gate $e_2$ is "high". Consequently, at the instant that source 15 supplies a clock pulse, only switching transistor $T_{24}$ is turned on and the current $I_a - 2I_r$ flows to the current dividing circuit ($T_5$, $D_6$) and a current equal to $\frac{1}{2}(I_a - 2I_r)$ flows to connection point 70. Outside the sampling periods the current $I_a - 2I_r$ flows from the common point 25 to the current dividing circuit ($D_{21}$, $T_{23}$) and input 31 of the next stage $S_3$ only receives half the current $I_a - 2I_r$.

If the current $I_a$ is greater than $4I_r$, but smaller than $8I_r$, the fourth stage $S_4$ receives a current equal to $\frac{1}{4}(I_a - 4I_r)$, which current is smaller than the current $I_r$ of current source $C_{41}$, so that transistor $T_{42}$ remains conductive and transistor $T_{12}$, $T_{22}$ and $T_{32}$ are cut off and the detection outputs 14, 24, 34 are consequently "high", so that only the output of the EXCLUSIVE-OR gate $e_3$ is high and at the instant that the source 15 supplies a clock pulse switching transistor $T_{34}$ is turned on, via which switching transistor the current equal to $\frac{1}{2}(I_a - 4I_r)$ flows from junction 35 to the current dividing circuit ($T_5$, $D_6$). Connection point 70 then receives a current equal to $\frac{1}{4}(I_a - 4I_r)$, which is equal to the residual current on junction 45 outside the sampling periods.

Figure 7:
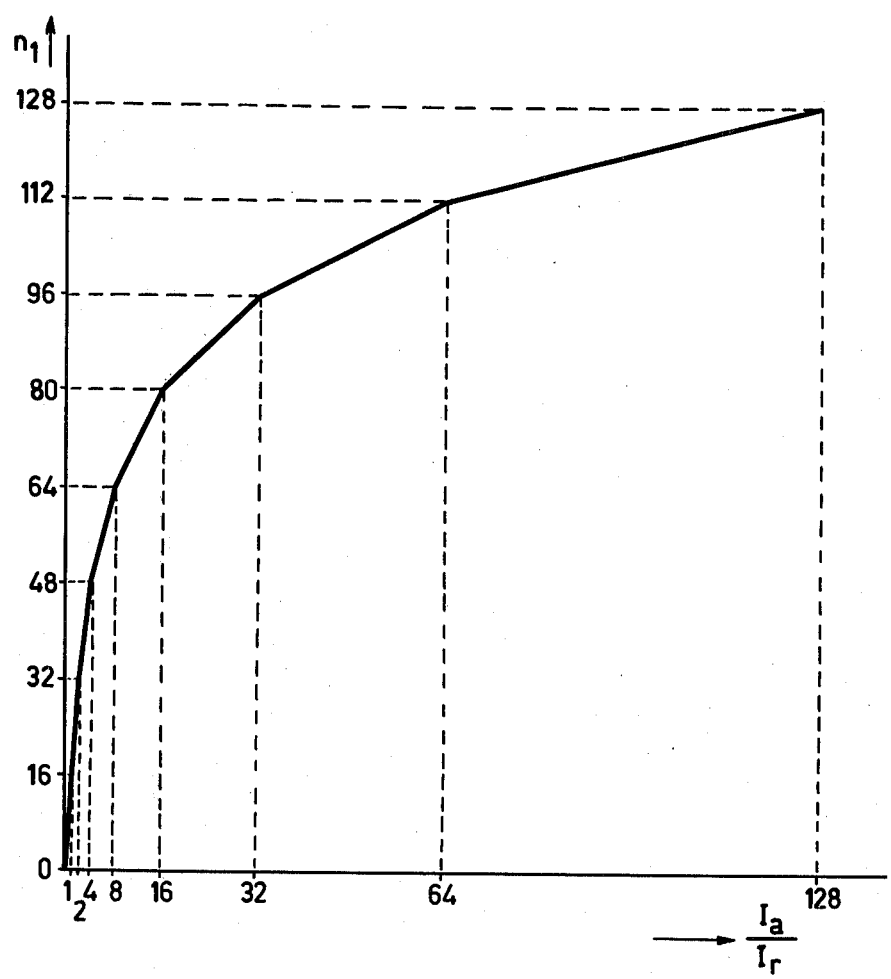
FIG. 7 shows the sensitivity curve of the analog-to-digital converter in accordance with FIG. 6.

FIG. 7 shows the sensitivity curve of the analog-digital converter in accordance with FIG. 6. Along the vertical axis the number of counting steps $n_1$ of the analog-to-digital converter 16 is plotted and along the horizontal axis the ratio $I_a/I_r$ between the analog signal current $I_a$ and the reference current $I_r$. Input currents $I_a$ with a value between 0 and $I_r$ are digitized in 16 steps, and so are the values between $I_r$ and $2I_r$, between $2I_r$ and $4I_r$, $4I_r$ and $8I_r$, $8I_r$ and $16I_r$, $16I_r$ and $32I_r$, $32I_r$ and $64I_r$ and between $64I_r$ and $128I_r$. Thus, input currents of low amplitude are quantitized in small steps (steps of $I_r/16$ for the total converter) and currents with a high amplitude in steps which on the average are greater (in the last stage of the total converter, this is stage $S_8$ with converter 16, in steps of $4I_r$). As a result, the dynamic range is increased in comparison with a linear converter, whilst maintaining the same ratio between the quantization-noise power and the signal power.

In this respect it is to be noted that the invention is by no means limited to the embodiments shown. In addition to the four forms shown of a stage of an analog-to-digital converter in accordance with the invention various other variants can be realized.

What is claimed is:

1. Analog-to-digital conversion circuit having a plurality of series-connected stages, each stage comprising:
   a common terminal;
   an output terminal;
   a first reference current source being connected to said common terminal;
   diode means connecting said common terminal to said output terminal forming a first current path and having a forward direction; the forward direction, viewed from said common terminal being the same for all stages in said series-connection and being the same as the current direction of said reference current source;
   a current sink;
   a logic output;
   a first transistor, the base being connected to said common terminal, the emitter being connected to said current sink and a collector being connected to said logic output, forming a second current path, said first transistor having a conductivity type such that the forward direction of its base-emitter junction, viewed from said common terminal, is opposite to the forward direction of said diode means; and means for biasing said two current paths such that at one time only one of said two current paths is forward biased;

said common terminal of the first stage of said series-connection forming an input for an analog input current and the common terminal of each other stage being connected to the output terminal of the stage preceding it.

means for detecting the polarity of said difference serving to indicate the level of current output of said stage;

a detection output terminal connected to said polarity detection means to provide digital indication of the level of current at each stage;

means to count the number of successive stages having a positive current on said current output terminal; said count being a digital measure of the magnitude of said input current.

2. Analog-to-digital conversion circuit as claimed in claim 1, wherein each stage further comprises:

a second reference current source for delivering substantially the same current as said first reference current source and being connected to the collector of said first transistor in such a way that the direction of the current of said second current source is the same as the direction of the collector current in said first transistor;

a summing terminal common to all stages;

a first diode connecting the junction point between said second current source and the collector of said first transistor to said summing terminal common to all stages, the forward direction of said first diode, viewed from said junction point, being opposite to the direction of current in said second current source; and said summing terminal being connected to means for sinking a current substantially equal to said analog-input current from said summing terminal.

3. Analog-to-digital conversion circuit as claimed in claim 2, wherein in each stage said logic output is provided by an additional collector contact on said first transistor, said logic output providing a measure of the input current.

4. Analog-to-digital conversion circuit as claimed in claim 1, wherein each stage comprises a second diode between base and collector of said first transistor for preventing said first transistor from bottoming.

5. Analog-to-digital conversion circuit as claimed in claim 2, wherein each stage comprises a second diode between base and collector of said first transistor for preventing said first transistor from bottoming.

6. Analog-to-digital conversion circuit as claimed in claim 3, wherein each stage comprises a second diode between base and collector of said first transistor for preventing said first transistor from bottoming.

7. Analog-to-digital conversion circuit as claimed in claim 1, wherein each stage except the first one in said series-connection further comprises:

a summing terminal;

a second transistor, the emitter being connected to said common terminal and the collector being connected to said summing terminal common to the collector of said second transistor of each stage; and logic gating means with a first and a second input and an output, the output being connected to the base of said second transistor, the first input being connected to the collector of said first transistor and the second input being connected to the collector of said first transistor of the preceding stage, said logic gating means being logically coded such that the corresponding second transistor is conducting when the corresponding first transistor is conductive and the first transistor of the preceding stage is non-conductive; and wherein the first stage in said series-connection comprises:

a second transistor, the emitter being connected to said common terminal and the collector being connected to said summing terminal; and coupling means coupling the collector of the corresponding first transistor to the base of the second transistor of the first stage in such a way that said second transistor is conductive when the corresponding first transistor is conductive.

8. Analog-to-digital conversion circuit as claimed in claim 1, wherein at least one stage comprises current dividing means with an input connected to the common terminal of that stage and a first and a second current circuit for dividing the current at the input of the current dividing means between said two current circuits with a fixed ratio, the first current circuit being connected between the common terminal and the output terminal of said stage and incorporating said diode means and the second current circuit being connected between said common terminal and a current sink.

9. Analog-to-digital conversion circuit as claimed in claim 2, wherein at least one stage comprises current dividing means with an input connected to the common terminal of that stage and a first and a second current circuit for dividing the current at the input of the current dividing means between said two current circuits with a fixed ratio, the first current circuit being connected between the common terminal and the output terminal of said stage and incorporating said diode means and the second current circuit being connected between said common terminal and a current sink.

10. Analog-to-digital conversion circuit as claimed in claim 3, wherein at least one stage comprises current dividing means with an input connected to the common terminal of that stage and a first and a second current circuit for dividing the current at the input of the current dividing means between said two current circuits with a fixed ratio, the first current circuit being connected between the common terminal and the output terminal of said stage and incorporating said diode means and the second current circuit being connected between said common terminal and a current sink.

11. Analog-to-digital conversion circuit as claimed in claim 4, wherein at least one stage comprises current dividing means with an input connected to the common terminal of that stage and a first and a second current circuit for dividing the current at the input of the current dividing means between said two current circuits with a fixed ratio, the first current circuit being connected between the common terminal and the output terminal of said stage and incorporating said diode means and the second current circuit being connected between said common terminal and a current sink.

12. Analog-to-digital conversion circuit as claimed in claim 5, wherein at least one stage comprises current dividing means with an input connected to the common terminal of that stage and a first and a second current circuit for dividing the current at the input of the current dividing means between said two current circuits with a fixed ratio, the first current circuit being connected between the common terminal and the output terminal of said stage and incorporating said diode means and the second current circuit being connected between said common terminal and a current sink.

13. Analog-to-digital conversion circuit as claimed in claim 6, wherein at least one stage comprises current dividing means with an input connected to the common terminal of that stage and a first and a second current circuit for dividing the current at the input of the current dividing means between said two current circuits with a fixed ratio, the first current circuit being connected between the common terminal and the output terminal of said stage and incorporating said diode means and the second current circuit being connected between said common terminal and a current sink.

14. Analog-to-digital conversion circuit as claimed in claim 7, wherein at least one stage comprises current dividing means with an input connected to the common terminal of that stage and a first and a second current circuit for dividing the current at the input of the current dividing means between said two current circuits with a fixed ratio, the first current circuit being connected between the common terminal and the output terminal of said stage and incorporating said diode means and the second current circuit being connected between said common terminal and a current sink.

15. Analog-to-digital conversion circuit as claimed in claim 8, wherein at least one stage comprises current dividing means with an input connected to the common terminal of that stage and a first and a second current circuit for dividing the current at the input of the current dividing means between said two current circuits with a fixed ratio, the first current circuit being connected between the common terminal and the output terminal of said stage and incorporating said diode means and the second current circuit being connected between said common terminal and a current sink.

16. An analog-to-digital conversion circuit comprising:
   a plurality of series-connected stages, each stage comprising:
   a first input terminal for receiving a signal current input;
   a second input terminal for receiving a reference current input;
   means for determining the difference between the values of said signal input current and said reference input current applied to said means;
   a common point for receiving said difference;
   means for detecting the polarity of said difference;
   a current output terminal;
   a first current path between said common point and said current output terminal for transferring a current to said current output terminal which is proportional to said difference if said difference is positive;
   the first input current of a following state being constituted by said positive current at said current output of the stage which precedes it;
   a current sink;
   a second current path between said common point and a current sink for draining said difference if it is negative;
   said two current paths each having a forward and a reverse direction, the forward directions in the two current paths, viewed from said common point, being oppositely directed, and the impedance in the forward direction of the one current path being low relative to the impedance in the reverse direction of the other current path viewed from the common point;
   means for biasing said two current paths such that at one time only one of the two current paths is forward-biased;
   said means for detecting the polarity of said difference serving to indicate the level of current output of said stage;
   a detection output terminal connected to said polarity detection means to provide digital indication of the level of current at each stage;
   means to count the number of successive stages having a positive current on said current output terminal; said count being a digital measure of the magnitude of said input current.

17. An analog-to-digital conversion circuit as claimed in claim 16, wherein for each stage:
   said first current path comprises the collector-emitter path of a first transistor of a first conductivity type;
   said second current path comprises the collector-emitter path of a second transistor of a conductivity type opposite to the first conductivity type;
   the emitters of said transistors being connected to said common point;
   the collector of said first transistor being connected to the current output of said stage;
   the collector of said second transistor being connected to a current sink; and
   the base electrodes of said two transistors being connected to bias means to maintain a voltage between the two base electrodes of said transistors such that said two transistors cannot conduct simultaneously.

18. An analog-to-digital conversion circuit as claimed in claim 16, wherein:
   said first current path is the main current path of a first insulated-gate field-effect transistor;
   said second current path is the collector-emitter path of a second transistor of a conductivity type opposite to the conductivity type of said first transistor;
   the source electrode of said first transistor being connected to said common point and the drain electrode to the current output of said stage;
   the emitter of said second transistor being connected to said common point and the collector to a current sink;
   the gate electrode of said first transistor and the base electrode of said second transistor being connected to bias means such that said two transistors cannot conduct at the same time; and
   said bias means being common to a plurality of stages.

19. An analog-to-digital conversion circuit as claimed in claim 16, wherein:
   said first current path includes a diode and said second current path the base-emitter junction of a transistor whose collector leads to said current sink;
   said bias means being constituted by a point of reference potential to which the emitters of all transistors in said second current path of a plurality of consecutive stages are connected;
   the output of each preceding stage being connected to the common point of a following stage; and
   each stage having a reference current source for supplying said second input current, the current direction of said reference current source, viewed from the common point, being the same as the forward direction of the semiconductor junction in the first current path of said stage.

20. An analog-to-digital conversion circuit as claimed in claim 16, wherein each stage further includes:
a reference current source for supplying said second input current, the current direction of said reference current source, viewed from said common point, being the same as the forward direction of said first current path;
the forward directions of said first current paths of at least a plurality of series-connected stages being equally directed; and
the output of each preceding stage being connected to the common point of a following stage.

21. An analog-to-digital conversion circuit as claimed in claim 17, wherein each stage includes:
a reference current source for supplying said second input current, the current direction of said reference current source, viewed from said common point, being the same as the forward direction of said first current path;
the forward directions of said first current paths of at least a plurality of series-connected stages being equally directed; and
the output of each preceding stage being connected to the common point of a following stage.

22. An analog-to-digital conversion circuit as claimed in claim 18, wherein each stage comprises:
a reference current source for supplying said second input current, the current direction of said reference current source, viewed from said common point, being the same as the forward direction of said first current path;
the forward directions of said first current paths of at least a plurality of series-connected stages being equally directed; and
the output of each preceding stage being connected to the common point of a following stage.

23. An analog-to-digital conversion circuit as claimed in claim 16, wherein said second current path of at least one of said stages includes a current dividing circuit.

24. An analog-to-digital conversion circuit as claimed in claim 17, wherein said second current path of at least one of said stages includes a current dividing circuit.

25. An analog-to-digital conversion circuit as claimed in claim 18, wherein said second current path of at least one of said stages includes a current dividing circuit.

26. An analog-to-digital conversion circuit as claimed in claim 19, wherein said second current path of at least one of said stages includes a current dividing circuit.

27. An analog-to-digital conversion circuit as claimed in claim 20, wherein said second current path of at least one of said stages includes a current dividing circuit.

28. An analog-to-digital conversion circuit as claimed in claim 19, wherein in at least one of said stages said diode is shunted by the basis-emitter junction of a transistor whose base is connected to one electrode of said diode, whose emitter is connected to the other electrode of said diode, and whose forward direction is the same as the forward direction of said collector-base junction.

29. An analog-to-digital conversion circuit as claimed in claim 19, wherein said collector-base junction of said transistor is shunted by a diode whose forward direction is the same as the forward direction of said collector-base junction.

30. An analog-to-digital conversion circuit as claimed in claim 19, wherein said transistor has a second collector contact for the formation of a detection means.

31. An analog-to-digital conversion circuit as claimed in claim 19, wherein:
said collector of said transistor in said second current path of each stage leads to gates of a logic circuit for detecting conduction or nonconduction of said transistor;
said logic circuit controlling a number of switching transistors whose emitters are connected to the common points of a different stages;
such that said logic circuit, if the transistor included in the second current path of a stage is conductive and the corresponding transistor of the preceding stage is non-conductive, turns on that switching transistor whose emitter is connected to the common point of said preceding stage, the collectors of said switching transistors leading to a further analog-to-digital converter.

* * * * *